United States Patent
Choi et al.

(10) Patent No.: US 9,970,617 B2
(45) Date of Patent: May 15, 2018

(54) COPPER CLAD LAMINATE FOR VEHICLE LED LAMP, PRINTED CIRCUIT BOARD INCLUDING THE SAME, AND MANUFACTURING METHOD THEREOF

(71) Applicants: Hyundai Motor Company, Seoul (KR); Kia Motors Corporation, Seoul (KR)

(72) Inventors: Seung Woo Choi, Seoul (KR); Ho Sub Kim, Seoul (KR); Young Do Kim, Daejeon (KR); Cheol Ho Kim, Chungcheongbuk-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 50 days.

(21) Appl. No.: 15/181,897

(22) Filed: Jun. 14, 2016

(65) Prior Publication Data

US 2017/0241604 A1 Aug. 24, 2017

(30) Foreign Application Priority Data

Feb. 24, 2016 (KR) ........................ 10-2016-0022157

(51) Int. Cl.
*H05K 1/03* (2006.01)
*H05K 1/09* (2006.01)
(Continued)

(52) U.S. Cl.
CPC .......... *F21S 48/115* (2013.01); *H05K 1/0346* (2013.01); *H05K 1/09* (2013.01);
(Continued)

(58) Field of Classification Search
CPC .......... H05K 1/0353; H05K 2201/0129; B32B 27/00; B32B 27/08; B32B 27/32; B32B 15/08; C23C 30/005; C08J 2379/08
See application file for complete search history.

(56) References Cited

U.S. PATENT DOCUMENTS

| 5,379,784 A * | 1/1995 | Nishi ...................... B08B 11/02 |
| | | 134/102.3 |
| 2001/0055691 A1* | 12/2001 | Yamamoto .............. B32B 15/08 |
| | | 428/473.5 |

(Continued)

FOREIGN PATENT DOCUMENTS

| JP | 2012-124498 A | 6/2012 |
| JP | 2014-195947 A | 10/2014 |

(Continued)

*Primary Examiner* — Hoa C Nguyen
(74) *Attorney, Agent, or Firm* — Mintz Levin Cohn Ferris Glovsky and Popeo, P.C.; Peter F. Corless

(57) ABSTRACT

A flexible copper-clad laminate for a vehicle LED lamp is provided and includes a copper-clad layer and a composite layer that are laminated. The composite layer includes a polyimide layer and thermoplastic polyimide layers. An outermost layer of the composite layer is formed as a thermoplastic polyimide layer. A total thickness of the thermoplastic polyimide layers and an entire thickness of the polyimide layer with respect to a total thickness of the composite layer is about 10 to 50% and 50 to 90%, respectively. The total thickness of the thermoplastic polyimide layers and the entire thickness of the polyimide layer with respect to the thickness of the composite layer is about 20 to 40% and 60 to 80%, respectively. A thickness of the copper-clad layer is about 30 to 80 μm, and the total thickness of the composite layer is about 10 to 15 μm.

14 Claims, 1 Drawing Sheet

(51) Int. Cl.
  *F21S 8/10* (2006.01)
  *H05K 3/00* (2006.01)
(52) U.S. Cl.
  CPC ... *H05K 3/0014* (2013.01); *H05K 2201/0154* (2013.01); *H05K 2201/05* (2013.01); *H05K 2201/10106* (2013.01); *H05K 2201/10113* (2013.01)

(56) References Cited

U.S. PATENT DOCUMENTS

2002/0031868 A1* 3/2002 Capote ................. H01L 21/563
  438/126
2011/0114371 A1* 5/2011 Lin ........................ B32B 7/12
  174/254
2012/0155055 A1* 6/2012 Kang .................... H01L 23/562
  361/820

FOREIGN PATENT DOCUMENTS

KR  10-2001-0093746 A  10/2001
KR  10-2012-0040422 A  4/2012

* cited by examiner

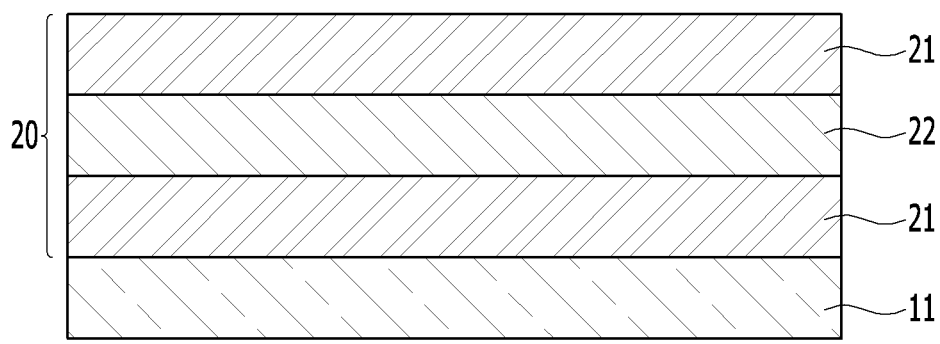

COPPER CLAD LAMINATE FOR VEHICLE LED LAMP, PRINTED CIRCUIT BOARD INCLUDING THE SAME, AND MANUFACTURING METHOD THEREOF

CROSS-REFERENCE TO RELATED APPLICATION

This application claims priority to and the benefit of Korean Patent Application No. 10-2016-0022157 filed in the Korean Intellectual Property Office on Feb. 24, 2016, the entire contents of which are incorporated herein by reference.

BACKGROUND (a) Field of the Invention

The present invention relates to a copper-clad laminate for a vehicle light emitting diode (LED) lamp, a printed circuit board including the same, and a manufacturing method thereof.

(b) Description of the Related Art

Recently, use of environmentally-friendly LED lighting devices has increased because of their excellent efficiency and lifespan, and particularly in a vehicle, lamps in which high efficiency LEDs operated with low power have been used as a light source have gained a great deal of attention. In order to ensure front and rear sight and to ensure visibility of the vehicle during daytime driving, a headlamp, a daytime running light lamp, a rear combination lamp, and the like have been used in the vehicle, and for this purpose, high luminance LED lamps may be required.

Since the high luminance LED light source emits about 70 to 80% of inputted energy as heat, when the high luminance LED lamp is applied, the heat generated therefrom should be properly released. When the heat generated from the high luminance LED lamp is not effectively released, since temperature thereof rises, a normal operation of the LEDs may be disturbed, and a failure rate of parts of the high luminance LED lamp may increase, the light efficiency and lifespan thereof may deteriorate. In addition, damage and malfunction of mechanical parts thereof may occur due to thermal stress or thermal expansion. Accordingly, to manufacture an excellent LED head lamp with an excellent heat dissipation characteristic, use of an LED chip with high efficiency and an excellent circuit board with an excellent heat dissipation characteristic may be required.

Further, a flexible printed circuit board (FPCB) that may be three-dimensionally designed as applied to a vehicle exterior LED lamp has been researched as a circuit board. In this case, a flexible copper-clad laminate (FCCL) having the excellent heat dissipation characteristic is required. The FCCL using an insulating layer formed of a polyimide (PI) may be classified into a 2-FCCL and a 3-FCCL depending on presence or absence of an adhesive, wherein the adhesive used in the 3-FCCL is an epoxy or acryl adhesive. However, because of a thickness and low thermal conductivity of an adhesive layer of the 3-FCCL using the adhesive, the 3-FCCL has a less heat dissipation characteristic than the 2-FCCL. In order to improve the heat dissipation characteristic in the conventional FCCL, a heat dissipation filler made of alumina, boron nitride, aluminum nitride, and the like can be added to a PI-based insulating layer. However, since the added heat dissipation filler causes deterioration of mechanical strength of the insulating layer, reducing a thickness of the insulating layer may be necessary as ensuring the mechanical strength thereof.

The above information disclosed in this Background section is only for enhancement of understanding of the background of the invention and therefore it may contain information that does not form the prior art that is already known in this country to a person of ordinary skill in the art.

SUMMARY

Thus, in preferred aspect, the present invention provides a copper-clad laminate for a vehicle LED lamp having excellent heat dissipation characteristics, and a manufacturing method thereof. The copper clad laminate may be flexible, which may be provided by a substantially reduced thickness of components constituting the laminated structure, and thus prepared printed circuit board may also be flexible.

The term "flexible" is meant by easily being bent, modified, altered, or adjustable by a force or pressure without breaking thereby providing suitably physical properties (e.g. dimensional stability and flex resistance). In certain embodiments, the flexible copper clad laminate in the present invention may not be easily breakable as being bent, modified, altered or adjusted by a force applied thereon. Unless otherwise indicated herein, the copper clad laminate in the present invention may be flexible thereby indicating a flexible copper clad laminate.

In one aspect, provided is a flexible printed circuit board for a vehicle LED lamp having excellent heat dissipation characteristics.

The copper-clad laminate for a vehicle LED lamp may comprise a copper-clad layer and a composite layer, which may be laminated. The composite layer may include a polyimide layer and a plurality of thermoplastic polyimide layers, and an outermost layer of the composite layer may be one of the plurality of the thermoplastic polyimide layer.

Preferably, a total thickness of the plurality of thermoplastic polyimide layers may be about 10 to 50% with respect to a total thickness of the composite layer, and a total thickness of the polyimide layer may be about 50 to 90% with respect to a total thickness of the composite. Further, in detail, the total thickness of the plurality of thermoplastic polyimide layers may be about 20 to 40% with respect to a total thickness of the composite and the total thickness of the polyimide layer may be about 60 to 80% with respect to the total thickness of the composite. Particularly, the total thickness of the plurality of the thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

A thickness of the copper-clad layer may be about 30 to 80 μm, and the total thickness of the composite layer may be about 10 to 15 μm.

A coefficient of linear thermal expansion (CTE) of the composite layer may be about 15 to 30 ppm/° C., and a heat resistance of the flexible copper-clad laminate may be equal to or less than about 15 K/W.

A CTE of the used polyimide layer may be about 5 to 20 ppm/° C., and a CTE of the thermoplastic polyimide layer may be about 30 to 70 ppm/° C.

In another aspect, the present invention provides a manufacturing method of a flexible copper-clad laminate for a vehicle LED lamp. The method may comprise: preparing a copper-clad layer; forming a first thermoplastic polyimide precursor layer by casting and then drying a first thermoplastic polyimide precursor resin on the copper-clad layer;

forming a polyimide precursor layer by casting and then drying a polyimide precursor resin on the first thermoplastic polyimide precursor layer; forming a second thermoplastic polyimide precursor layer by casting and then drying a second thermoplastic polyimide precursor resin on the polyimide precursor layer; and curing, by a heat treatment, the first thermoplastic polyimide precursor layer, the polyimide precursor layer, and the second thermoplastic polyimide precursor layer to form a composite layer.

A total thicknesses of the first thermoplastic polyimide layer and the second thermoplastic polyimide layer may be about 10 to 50% with respect to a total thickness of a composite layer, and a total thickness of the polyimide layer may be about 50 to 90% with respect to the total thickness of a composite layer. In particular, the total thicknesses of the first thermoplastic polyimide layer and the second thermoplastic polyimide layer may be about 20 to 40% with respect to the thickness of the composite layer and the total thickness of the polyimide layer may be about 60 to 80% with respect to the thickness of the composite layer. Particularly, the total thickness of the first and the second thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

The first thermoplastic polyimide precursor resin and the second thermoplastic polyimide precursor resin may be same.

A thickness of the copper-clad layer may be about 30 to 80 μm, and the total thickness of the composite layer may be about 10 to 15 μm.

A CTE of the composite layer may be about 15 to 30 ppm/° C., and a heat resistance of the flexible copper-clad laminate may be equal to or less than about 15 K/W.

The forming of the first thermoplastic polyimide precursor layer and the forming of the polyimide precursor layer may be repeated a plurality of times.

The CTE of the polyimide layer may be about 5 to 20 ppm/° C.

The respective CTEs of the first thermoplastic polyimide layer and the second thermoplastic polyimide layer may be about 30 to 70 ppm/° C.

Further, the present invention provides a flexible printed circuit board for a vehicle LED lamp comprising the copper-clad laminate for the vehicle LED lamp as described herein.

Additionally, the present invention provides a vehicle that may comprise the flexible printed circuit board as described above.

Other aspects of the invention are disclosed infra.

As such, the flexible copper-clad laminate for the vehicle LED lamp of various exemplary embodiments of the present invention may have reduced heat resistance by reducing a thickness of the composite layer, and to obtained excellent heat dissipation characteristics without an additional ceramic filler due to its low heat resistance.

The copper-clad laminate for the vehicle LED lamp according to various exemplary embodiments of the present invention may have excellent mechanical properties and dimensional stability, regardless of an insulating layer thinned by no additional ceramic filler.

The flexible copper-clad laminate for the vehicle LED lamp according to exemplary embodiments of the present invention can be variously designed and manufactured because of being capable of using a thin and bendable circuit board.

BRIEF DESCRIPTION OF THE DRAWING

It should be understood that the accompanying drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

FIG. 1 illustrates a schematic diagram of an exemplary flexible copper-clad laminate for a vehicle LED lamp according to an exemplary embodiment of the present invention.

DESCRIPTION OF SYMBOLS

100: flexible copper-clad laminate
11: copper-clad layer
20: composite layer
21: thermoplastic polyimide layer
22: polyimide layer

DETAILED DESCRIPTION

The advantages and features of the present invention and the methods for accomplishing the same will be apparent from the exemplary embodiments described hereinafter with reference to the accompanying drawings. However, the present invention is not limited to the exemplary embodiments described hereinafter, but may be embodied in many different forms. The following exemplary embodiments are provided to make the invention of the present invention complete and to allow those skilled in the art to clearly understand the scope of the present invention, and the present invention is defined only by the scope of the appended claims. Throughout the specification, the same reference numerals denote the same constituent elements.

In some exemplary embodiments, detailed description of well-known technologies will be omitted to prevent the invention of the present invention from being interpreted ambiguously. Unless otherwise defined, all terms (including technical and scientific terms) used herein have the same meaning as commonly understood by one of ordinary skill in the art.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

FIG. 1 illustrates a schematic diagram of an exemplary flexible copper-clad laminate for a vehicle LED lamp according to an exemplary embodiment of the present invention.

In a flexible copper-clad laminate 100 for a vehicle LED lamp according to an exemplary embodiment of the present invention, a copper-clad layer 11 and a composite layer 20 may be sequentially laminated. The composite layer 20 may include a polyimide layer 22 and a plurality of thermoplastic polyimide layers 21, and an outermost layer of the composite layer 20 may be one of the thermoplastic polyimide layer 21.

In the exemplary embodiment of the present invention, productivity and required physical properties of the FCCL may be ensured due to a multi-layered structure of the composite layer 20. Preferably, the outermost layer of the composite layer 20 may be coated to be the thermoplastic polyimide layer 21 to improve adhesion to the copper-clad layer 11. FIG. 1 illustrates an example in which the outermost layer of the composite layer 20 is the thermoplastic polyimide layer 21.

As in the exemplary embodiment of the present invention, when a polyimide-based flexible copper-clad laminate is applied as a material of the flexible printed circuit board, a thickness of the composite layer 20 may be substantially reduced, and the thickness of the used copper-clad layer may be greater than the thickness of the composite layer 20, the heat dissipation thereof may be substantially improved. Preferably, the thickness of the copper-clad layer 11 may be about 30 to 80 µm, and the total thickness of the composite layer 20 may be about 10 to 15 µm. As the total thickness of the composite layer 20 is reduced and the thickness of the copper-clad layer is increased, the heat dissipation may be improved. When the total thickness of the composite layer 20 is less than the predetermined range, for example, less than about 10 µm, process defects and reliability deterioration may occur during manufacturing of the flexible printed circuit board. Accordingly, it is preferable to limit the thicknesses of the copper-clad layer and the composite layer 20 to the ranges described above.

Preferably, a ratio of the thickness of the copper-clad layer 11 to the total thickness of the composite layer 20 (i.e. the thickness of copper-clad layer 11/the total thickness of the composite layer 20), may be about 2 or greater.

In the exemplary embodiment of the present invention, a thickness ratio between the thermoplastic polyimide layer 21 having a high coefficient of linear thermal expansion (CTE) and a low modulus and the polyimide layer 22 having a low coefficient of linear thermal expansion (CTE) and a high modulus may be adjusted. The thermoplastic polyimide layer 21 may have an excellent thermal conductivity compared to the polyimide layer 22 when the thermoplastic polyimide layer 21 has a high CTE. When a single thermoplastic polyimide layer 21 is formed so as to reduce heat resistance thereof, it may be difficult to achieve dimensional stability required in the flexible copper-clad laminate 100 for the vehicle LED lamp and to obtain physical properties such as curl resistance of the polyimide after removing the copper-clad layer. Accordingly, by adjusting the thickness ratio of the thermoplastic polyimide layer 21 and the polyimide layer 22 in the exemplary embodiment of the present invention, the basically physical properties required by the flexible copper-clad laminate 100 for the vehicle LED lamp may be satisfied, the CTE of the composite layer 20 may be adjusted in a predetermined appropriate range, and the heat resistance of the flexible copper-clad laminate 100 for the vehicle LED lamp may be reduced.

The total thickness of the plurality of thermoplastic polyimide layers 21 with respect to the total thickness of the composite layer 20 suitably may be about 10 to 50%, and the total thickness of the polyimide layer 22 with respect to the total thickness of the composite layer 20 may be about 50 to 90%. Preferably, the total thickness of the plurality of thermoplastic polyimide layers 21 with respect to the thickness of the composite layer 20 may be about 20 to 40%, and the total thickness of the polyimide layer 22 with respect to the thickness of the composite layer 20 may be about 60 to 80%. Particularly, the total thickness of the plurality of the thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

When the thickness ratio of the thermoplastic polyimide layer 21 to the polyamide layer is increased, the CTE of the composite layer 20 may be increased, thus the heat dissipation characteristics may be improved, but the dimensional stability and the curl of the polyimide after removing the copper-clad layer may deteriorate. Accordingly, it is preferable to adjust the thickness ratio in the range described above.

As described above, the CTE of the composite layer 20 in which the thickness ratio may be adjusted may be about 15 to 30 ppm/° C. In the exemplary embodiment of the present invention, the composite layer 20 may have a thermal expansion coefficient of a level similar to the CTE of the copper-clad layer 11, thereby having excellent heat dissipation characteristics. Preferably, the heat resistance of the flexible copper-clad laminate 100 for the vehicle LED lamp according to the exemplary embodiment of the present invention that is measured by a measuring method using T3Ster® may be equal to or less than about 15 K/W.

FIG. 1 illustrates the structure of an exemplary flexible copper-clad laminate for the vehicle LED lamp according to the exemplary embodiment of the present invention. In the example illustrated in FIG. 1, the thermoplastic polyimide layer 21 and the polyimide layer 22 are alternately laminated. As illustrated in FIG. 1, when the thermoplastic polyimide layer 21 and the polyimide layer 22 are alternately laminated to have a symmetrical structure, even if the copper-clad layer is removed, curling may not occur, and the physical properties such as the dimensional stability may remain excellent.

Hereinafter, respective components will be described in detail.

The copper-clad layer 11 may include a rolled or electrolytic copper foil, and each thickness and each type of the copper foil may be applied thereto, and other metal-clad layers excluding the copper-clad layer may be used. The thickness of the copper-clad layer 11 may be about 30 to 80 µm.

According to the exemplary embodiment of the present invention, the thermoplastic polyimide layer and the polyimide layer may be manufactured by forming a precursor layer with a polyamic acid solution having desired physical properties such as a linear thermal expansion coefficient or modulus and then by curing or polymerizing into polyamide using the precursor layers. Any polyamic acid solution which is generally used in the art of the present invention may be used without being limited.

The polyamic acid solution used in the exemplary embodiment of the present invention may be manufactured by mixing a dianhydride and a diamine in a mole ratio of about 1:0.9 to 1:1.1 in an organic solvent. When the polyamic acid solution of the present invention is manufactured, a polyimide-based resin having a desired CTE or modulus may be obtained by adjusting the mixed ratio of the dianhydride and the diamine, or by adjusting a mixed ratio among the dianhydrides or the diamines, and by adjusting kinds of the selected dianhydride and diamine. The dianhydride suitable for the exemplary embodiment of the present invention may include one or two or more selected from the group consisting of PMDA (pyromellitic dianhydride), BPDA (3,3',4,4'-biphenyltetracarboxylic dianhydride), BTDA (3,3',4,4'-benzophenone-tetracarboxylic dianhydride), ODPA (4,4'-oxy deep Talic dianhydride), ODA (4,4'-diaminodiphenyl ether), BPADA (4,4'-(4,4'-isopropyl-byphenoxy) by phthalic anhydride), 6FDA (2,2'-bis-(3,4-dicarboxylic acid phenyl) hexafluoropropane dianhydride), and TMEG (ethylene glycol bis(anhydro-trimellitate).

The diamine suitable for the exemplary embodiment of the present invention may include one or two or more selected from the group consisting of PDA (p-phenylene diamine), m-PDA (m-phenylene diamine), 4,4'-ODA (4,4'-oxydianiline), 3,4'-ODA (3,4'-oxydianiline), BAPP (2,2-bis(4-[4-aminophenoxy]-phenyl) propane), TPE-R (1,3-bis(4-aminophenoxy)benzene), BAPB: 4, 4,4'-bis(4-aminophenoxy)biphenyl, m-BAPS (2,2-bis(4-[3-aminophenoxy]phenyl) sulfone), HAB (3,3'-dihydroxy-4 4,4'-diamino biphenyl), and DABA (4,4'-diamino-benz anilide).

In addition, dianhydride or diamine, or compounds other than the compounds described above may be added to the polyamic acid solution in a small amount.

The CTE of the used polyimide layer 22 suitably may be about 5 to 20 ppm/° C., and the CTE of the thermoplastic polyimide layer 21 suitably may be about 30 to 70 ppm/° C.

The total thickness of the composite layer 20 may be about 10 to 15 µm. In the range, the composite layer may have excellent heat dissipation characteristics.

A manufacturing method of the flexible copper-clad laminate for the vehicle LED lamp according to the exemplary embodiment of the present invention. The method may comprise: preparing a copper-clad layer; forming a first thermoplastic polyimide precursor layer by casting and then drying a first thermoplastic polyimide precursor resin on the copper-clad layer; forming a polyimide precursor layer by casting and then drying a polyimide precursor resin on the first thermoplastic polyimide precursor layer; forming a second thermoplastic polyimide precursor layer by casting and then drying a second thermoplastic polyimide precursor resin on the polyimide precursor layer; and curing, by a heat treatment, the first thermoplastic polyimide precursor layer, the polyimide precursor layer and the second thermoplastic polyimide precursor layer to form a composite layer.

The first thermoplastic polyimide precursor resin and the second thermoplastic polyimide precursor resin may be same or different. Preferably, the first thermoplastic polyimide precursor resin and the second thermoplastic polyimide precursor resin may be same.

Hereinafter, respective steps for manufacturing the flexible copper-clad laminate will be specifically described.

First, the copper-clad layer is prepared. A description for the copper-clad layer may be the same as the above-mentioned description, so a repeated description thereof will be omitted.

Next, the thermoplastic polyimide precursor resin may be casted and then dried on the copper-clad layer to form the first thermoplastic polyimide precursor layer. The manufacturing method of the flexible copper-clad laminate may include a sputtering method, a laminating method, and a casting method. Process costs of the sputtering method may be expensive, and it is difficult to ensure adherence to the polyimide layer while forming the copper-clad layer to have a uniform thickness in the sputtering method. The casting method may be used in the exemplary embodiment of the present invention. When a liquid polyimide precursor solution is thickly coated on the copper-clad layer, the productivity may be reduced due to a low process speed. Further, since a curing degree thereof decreases due to its thick thickness while being thermally cured, mechanical strength and chemical resistance thereof may decrease, and since it is difficult to remove the solvent in the film, a defective appearance such as a foaming phenomenon may occur and dimensional stability may deteriorate. In the exemplary embodiment of the present invention, the composite layer may be formed as a multi-layered structure to ensure the productivity.

Next, the thermoplastic polyimide precursor resin may be casted and then dried on the copper-clad layer to form the first thermoplastic polyimide precursor layer. The forming of the first thermoplastic polyimide precursor layer and the forming of the polyimide precursor layer described above may be repeated a plurality of times.

Next, the thermoplastic polyimide precursor resin may be casted and then dried on the polyimide precursor layer to form the second thermoplastic polyimide precursor layer.

The total thickness of the first thermoplastic polyimide layer and the second thermoplastic polyimide layer with respect to the total thickness of the composite layer may be about 10 to 50%, and the total thickness of the polyimide layer with respect to the total thickness of the composite layer may be about 50 to 90%. Preferably, the total thickness of the first thermoplastic polyimide layer and the second thermoplastic polyimide layer may be about 20 to 40% with respect to the total thickness of the composite layer and the total thickness of the polyimide layer may be about 60 to 80% with respect to the total thickness of the composite layer. Particularly, the total thickness of the first and second thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

Each of the thicknesses of the first thermoplastic polyimide layer, the second thermoplastic polyimide layer, and the polyimide layer may be controlled by adjusting the coated amount of the first and the second thermoplastic polyimide precursor and the polyimide precursor.

Next, the composite precursor layer may be cured and converted into the composite layer by a heat treatment.

A flexible printed circuit board for a vehicle LED lamp according to another exemplary embodiment of the present invention may include the flexible copper-clad laminate for the vehicle LED lamp described above. As the flexible copper-clad laminate for the LED lamp is described above, a duplicate description thereof will be omitted.

EXAMPLE

Hereinafter, examples of the present invention and comparative examples will be described. These examples, however, should not in any sense be interpreted as limiting the scope of the present invention.

Synthesis Example 1

As in the contents represented in Table 1, a diamine of 318.4 g of PDA and 1299.8 g of TPE-R was agitated and completely dissolved in 25,879 g of a DMAc solution in a nitrogen atmosphere, and then 1300 g of BPDA and 948.7 g of BPDA were added therein several times as a dianhydride. Next, the agitated process was performed for about 24 h to prepare a polyamic acid solution. After the prepared polyamic acid solution was casted in a film shape having a thickness of 20 μm, it is heated up to a temperature of 350° C. for about 60 min, and then was cured while being maintained for about 30 min. A measured coefficient of linear thermal expansion was 42 ppm/K.

Synthesis Examples 2 to 4

Synthesis Examples 2 to 4 were prepared according to the composition and content of Table 1 in the same method as Synthesis Example 1.

TABLE 1

Composition and content of polyamic acid solution

| Classification | Dianhydride 1 | Dianhydride 2 | Diamine 1 | Diamine 2 | DMAc | CTE (ppm/K) |
|---|---|---|---|---|---|---|
| Synthesis Example 1 | BPDA 1300 g | BTDA 948.7 g | TPER 1299.8 g | PDA 318.4 g | 25,879 g | 42 |
| Synthesis Example 2 | BPDA 2350 g | | TPER 585.9 g | ODA 1195.9 g | 27,652 g | 61 |
| Synthesis Example 3 | PMDA 2400 g | | PDA 942.48 g | ODA 436.29 g | 25,289 g | 11 |
| Synthesis Example 4 | PMDA 2400 g | | PDA 824.67 g | ODA 654.44 g | 25,960 g | 19 |

Exemplary Embodiment 1

A TPI precursor was coated on a copper foil through the casting method by applying the solution of Synthesis Example 1 as a thermoplastic polyimide precursor (TPI) layer and by applying the solution of Synthesis Example 3 as a polyimide precursor (PI) layer, and then the PI precursor was coated thereon through the casting method, and the TPI precursor was again coated thereon through the casting method, and the heat treatment was applied thereto, such that a TPI-PI-TPI structure of composite PI layer was formed.

A thickness of the used copper-clad layer was about 35 μm, and an entire thickness of the PI composite layer was about 12.5 μm. A ratio of an entire thickness of the TPI layer and an entire thickness of the PI layer was summarized in Table 2.

A heat resistance test, dimensional stability, a bending degree, and the thermal expansion coefficient for the PI composite layer which were measured by the following method are summarized in Table 2.

(1) Heat resistance test: The LED was stacked on a copper-clad surface of the prepared FCCL, and a TIM (Thermal Interface Material) and an Al plate were sequentially laminated on a surface of the PI, and then after electric power was applied thereto, heat resistance depending on a temperature difference between the LED surface and a lower portion of the Al Plate was measured by the T3Ster.

(2) Dimensional stability: The dimensional stability depends on 'method B' of IPC-TM-650, 2.2.4. A position recognition hole was provided in each of four vertices of a rectangular-shaped specimen, a mechanical directional (MD) length and a width directional (TD) length of which was 275×255 mm, and after it was stored in a thermo-hygrostat at a temperature of 23° C. at 50% RH for 24 h, distances between respective holes were repeatedly measured three times to be averaged. Then, after a film in which a metal foil was etched was stored in an oven at a temperature of 150° C. for 30 min and then was stored in a thermo-hygrostat at a temperature of 23° C. at 50% RH for 24 h, the distances between respective holes were again measured, and after heating it, a dimensional change rate was calculated.

(3) Bending degree: A flexible copper-clad laminate was cut to a size of 100 mm×100 mm, was dipped in an etching solution, and then its copper foil was removed, thereby obtaining a polyimide film. The polyimide film was set on a flat table, and a maximum height of a bent or twisted portion thereof was measured.

(4) Thermal expansion coefficient (CTE): The thermal expansion coefficient was calculated by averaging values at a temperature between 100° C. and 200° C. among thermal expansion values measured while raising the temperature to 400° C. at a rate of 10° C. per min by a thermomechanical analyzer (TMA).

Except for changing the solution of Synthesis Example 2 with the TPI layer, the FCCL was prepared in the same method as in Exemplary Embodiment 1 described above.

Comparative Example 1

Except for merely forming the single PI layer by using the solution of Synthesis Example 4 without the TPI layer, the FCCL was prepared in the same method as in Exemplary Embodiment 1.

Comparative Example 2

Except for merely forming the single TPI layer by using the solution of Synthesis Example 1 without the PI layer, the FCCL was prepared in the same method as in Exemplary Embodiment 1.

Comparative Example 3

Except for changing the ratio of the entire thickness of the TPI layer and the entire thickness of the PI layer as in Table 2 by using solutions of Synthesis Examples 1 and 3, Comparative Example 3 was prepared in the same method as in Exemplary Embodiment 1.

Comparative Example 4

Except for changing the ratio of the entire thickness of the TPI layer and the entire thickness of the PI layer as in Table 2 by using solutions of Synthesis Examples 1 and 3, Comparative Example 4 was prepared in the same method as in Exemplary Embodiment 1.

Comparative Example 5

Except for sequentially stacking the PI layers by coating the solution of Synthesis Example 2 with the TPI layer and by using the solutions of Synthesis Examples 3 and 4, Comparative Example 5 was prepared in the same method as in Exemplary Embodiment 1.

TABLE 2

| Classification | CTE of each individual layer of composite PI layer (ppm/° C.) | Thickness ratio of TPI layer of composite PI layer | CTE of composite PI layer (ppm/° C.) | Heat resistance of FCCL (K/W) (requirement: ≤15 K/W) | Absolute value of maximum value of dimensional stability (%) (target physical properties: <0.1%) | Bending degree after copper-clad etching (mm) (requirement: <10 mm) |
|---|---|---|---|---|---|---|
| Exemplary Embodiment 1 | 442/11/42 | 40% | 23.4 | 15 | 0.05 | 0 |
| Exemplary Embodiment 2 | 61/11/61 | 30% | 26 | 14 | 0.08 | 5 |
| Comparative Example 1 | 19 | 0% | 19 | 20 | 0.04 | 30 |
| Comparative Example 2 | 42 | 100% | 42 | 10 | 0.2 | Circularly curled |
| Comparative Example 3 | 42/11/42 | 10% | 14.1 | 25 | 0.02 | 0 0 |
| Comparative Example 4 | 42/11/42 | 70% | 32.7 | 12 | 0.15 | 50 |
| Comparative Example 5 | 61/11/19 | 40% | 33.4 | 12 | 0.2 | 50 |

As shown in Table 2, it can be confirmed that in the FCCLs prepared in Exemplary Embodiment 1 and Exemplary Embodiment 2, since the thickness ratios of the PI layer and the TPI layer to the entire composite PI layer were within the above predetermined range, the heat resistance, the dimensional stability, and the bending degree thereof were excellent.

It can be confirmed that the heat resistance of Comparative Example 1 in which the single PI layer was merely formed was inferior. It can be confirmed that the heat resistance of Comparative Example 2 in which the single TPI layer was merely formed was excellent, but the dimensional stability and the bending degree thereof were inferior.

It can be confirmed that the heat resistance, the dimensional stability, and the bending degree of Comparative Examples 3 and 4 in which the thickness ratio of the TPI layer to the composite PI layer was not satisfied were inferior.

It can be confirmed that the outermost layer of the composite PI layer of Comparative Example 5 was not the TPI layer, and the dimensional stability and the bending degree thereof were inferior.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the embodiments described above are only examples and should not be construed as being limitative in any respects.

What is claimed is:

1. A copper-clad laminate for a vehicle LED lamp, comprising a copper-clad layer; and a composite polyimide layer, wherein the copper-clad layer and the composite layer are laminated, wherein the composite layer includes a polyimide layer and a plurality of thermoplastic polyimide layers, and an outermost layer of the composite layer is formed as a thermoplastic polyimide layer, wherein a total thickness of the plurality of thermoplastic polyimide layers is 10 to 50% with respect to a total thickness of the composite layer and a total thickness of the polyimide layer is 50 to 90% with respect to the total thickness of the composite layer, wherein a thickness of the copper-clad layer is 30 to 80 .mu.m, and the total thickness of the composite layer is 10 to 15 .mu.m, wherein a ratio of the thickness of the copper-clad layer to the total thickness of the composite layer is 2 or greater.

2. The copper-clad laminate of claim 1, wherein the total thickness of the plurality of thermoplastic polyimide layers is 20 to 40% with respect to the total thickness of the composite layer and the total thickness of the polyimide layer with respect to the thickness of the composite layer is 60 to 80 with respect to the total thickness of the composite layer.

3. The copper-clad laminate of claim 1, wherein a coefficient of linear thermal expansion (CTE) of the composite layer is 15 to 30 ppm/°C., and a heat resistance of the copper-clad laminate is equal to or less than 15 K/W.

4. The copper-clad laminate of claim 1, wherein the composite layer has a structure in which the polyimide layer and the plurality of the thermoplastic polyimide layers are alternately laminated.

5. The copper-clad laminate of claim 1, wherein a CTE of the polyimide layer is 5 to 20 ppm/°C.

6. The copper-clad laminate of claim 1, wherein each CTE of the plurality of thermoplastic polyimide layers is 30 to 70 ppm/°C.

7. A printed circuit board for a vehicle LED lamp, comprising a copper-clad laminate for a vehicle LED lamp described of claim 1.

8. A vehicle comprising a printed circuit board of claim 7.

9. A method of manufacturing a copper-clad laminate for a vehicle LED lamp, comprising: preparing a copper-clad layer; forming a first thermoplastic polyimide precursor layer by casting and then drying a first thermoplastic polyimide precursor resin on the copper-clad layer; forming a polyimide precursor layer by casting and then drying a polyimide precursor resin on the first thermoplastic polyimide precursor layer; forming a second thermoplastic polyimide precursor layer by casting and then drying a second thermoplastic polyimide precursor resin on the polyimide precursor layer; and curing, by a heat treatment, the first thermoplastic polyimide precursor layer, the polyimide precursor layer, and the second thermoplastic polyimide precursor layer to form a composite layer, wherein a total thicknesses of the first thermoplastic polyimide layer and the second thermoplastic polyimide layer is 10 to 50% with respect to a total thickness of the composite layer and a total thickness of the polyimide layer is 50 to 90% with respect to the total thickness of the composite layer, wherein a thickness of the copper-clad layer is 30 to 80 .mu.m, and the total thickness of the composite layer is 10 to 15 .mu.m, wherein a ratio of the thickness of the copper-clad layer to the total thickness of the composite layer is 2 or greater.

10. The method of claim 9, wherein the total thicknesses of the first thermoplastic polyimide layer and the second thermoplastic polyimide is 20 to 40% with respect to the thickness of the composite layer and the total thickness of the polyimide layer is 60 to 80% with respect to the thickness of the composite layer.

11. The method of claim 9, wherein a CTE of the composite layer is 15 to 30 ppm/°C., and a heat resistance of the flexible copper-clad laminate is equal to or less than 15 K/W.

12. The method of claim 9, wherein a CTE of the polyimide layer is 5 to 20 ppm/°C.

13. The method of claim 9, wherein each CTEs of the first thermoplastic polyimide layer and the second thermoplastic polyimide layer is 30 to 70 ppm/°C.

14. The method of claim 9, wherein the first thermoplastic polyimide precursor resin and the second thermoplastic polyimide precursor resin are same.

\* \* \* \* \*